United States Patent [19]

Sondermeyer et al.

[11] Patent Number: 5,675,656
[45] Date of Patent: Oct. 7, 1997

[54] POWER AMPLIFIER WITH CLIPPING LEVEL CONTROL

[75] Inventors: Jack C. Sondermeyer; James W. Brown, Sr., both of Meridian, Miss.

[73] Assignee: Peavey Electronics Corporation, Meridian, Miss.

[21] Appl. No.: 668,501

[22] Filed: Jul. 15, 1996

Related U.S. Application Data

[63] Continuation of Ser. No. 276,677, Jul. 15, 1994, abandoned.

[51] Int. Cl.⁶ .................................................. H03G 3/00
[52] U.S. Cl. ........................... 381/61; 381/63; 381/100; 84/737; 84/738; 84/740
[58] Field of Search ........................... 381/61, 63, 100; 84/735–739, 740–741

[56] References Cited

U.S. PATENT DOCUMENTS

| | | |
|---|---|---|
| 4,164,163 | 8/1979 | Rhodes . |
| 4,405,832 | 9/1983 | Sondermeyer . |
| 4,439,742 | 3/1984 | Sondermeyer . |
| 4,584,700 | 4/1986 | Scholz . |
| 4,627,094 | 12/1986 | Scholz . |
| 4,701,957 | 10/1987 | Smith . |
| 4,788,508 | 11/1988 | Kawai ........................... 330/51 |
| 4,809,336 | 2/1989 | Pritchard . |
| 4,811,401 | 3/1989 | Brown, Sr. et al. ........... 381/61 |
| 4,995,084 | 2/1991 | Pritchard . |
| 5,012,199 | 4/1991 | McKale . |
| 5,129,006 | 7/1992 | Hill et al. ..................... 381/100 |
| 5,131,044 | 7/1992 | Brown, Sr. et al. . |
| 5,133,014 | 7/1992 | Pritchard . |
| 5,133,015 | 7/1992 | Scholz . |
| 5,197,102 | 3/1993 | Sondermeyer ................ 381/96 |

FOREIGN PATENT DOCUMENTS

53-27020  3/1978  Japan .

*Primary Examiner*—Curtis Kuntz
*Assistant Examiner*—Duc Nguyen
*Attorney, Agent, or Firm*—Watson Cole Stevens Davis, P.L.L.C.

[57] ABSTRACT

In a power amplifier, a control device employing a dual ganged potentiometer is connected in the feedback circuits of successive amplifier stages to increase the gain of the front end stage while simultaneously reducing the gain in a subsequent stage when the control is turned down. A distortion circuit, such as a tube compression circuit, is coupled between the stages. When the control is turned down, the compression circuit is activated at a lower level that effectively reduces the output power of the second stage. Presence and resonance controls may be provided to tailor high and low frequency damping factor of the second stage and function until the compression circuitry is activated. A ripple reduction filter is provided in a filtered supply for the drivers in the second or power amplifier stage.

27 Claims, 4 Drawing Sheets

POWER AMPLIFIER WITH CLIPPING LEVEL CONTROL

This is a Continuation of application Ser. No. 08/276,677 filed Jul. 15, 1994, now abandoned.

BACKGROUND OF THE INVENTION

The invention relates to a solid state power amplifier which emulates tube distortion. In particular, the invention relates to a solid state power amplifier having a tube distortion circuit in which the power level of the amplifier may be continually varied while maintaining an appropriate tube distortion sound.

It is desirable to control the output capability of a power amplifier. It is particularly desirable for many musicians to use the power amplifier itself as the major contribution to the so-called tube distorted sound. Their desire is to have a high power amplifier capability for high level stage performances, and at the same time, a low power amplifier capability for studio performance. Many contemporary tube power amplifiers have a high/low switch for such purpose. Most solid state power amplifiers do not offer this feature. It is thus desirable to provide a variable power output and particularly a continuously variable output power capability in a power amplifier.

SUMMARY OF THE INVENTION

The invention is based upon the discovery that a limiting circuit may be employed between a first amplifier stage and a high-gain power amplifier stage to limit the output power. A control circuit coupled between feedback circuits of the each amplifier stage is operative to increase the gain of the first amplifier as the other is decreased and vice versa. As a result, the effect of the limiting circuit increases with increasing gain of the first amplifier and decreases with decreasing gain thereof.

In a particular embodiment, the invention is directed to an amplifier comprising a first amplifier stage having an input and an output and a feedback circuit; a power amplifier stage exhibiting inherent clipping distortion at high power outputs and having an input and an output and a feedback circuit; and a limiting circuit coupled between the input of the power amplifier and the output of the first amplifier for limiting the input to the power amplifier stage. A tube dynamics control is coupled between feedback circuits for simultaneously changing feedback impedance in the corresponding feedback circuit of the first amplifier and the power amplifier in opposite directions.

In an exemplary embodiment, the tube dynamics control comprises an impedance in the form of a dual ganged potentiometer or a dual gang resistor; and the limiting circuit is a diode clipping network. The limiting circuit may also include a compression circuit. The system may further include a presence and resonance circuit which operates to control the damping factor of the load circuit. The system may yet further include a ripple filter for reducing ripple distortion associated with the power amplifier at full power output.

DESCRIPTION OF THE INVENTION

Figure 1:
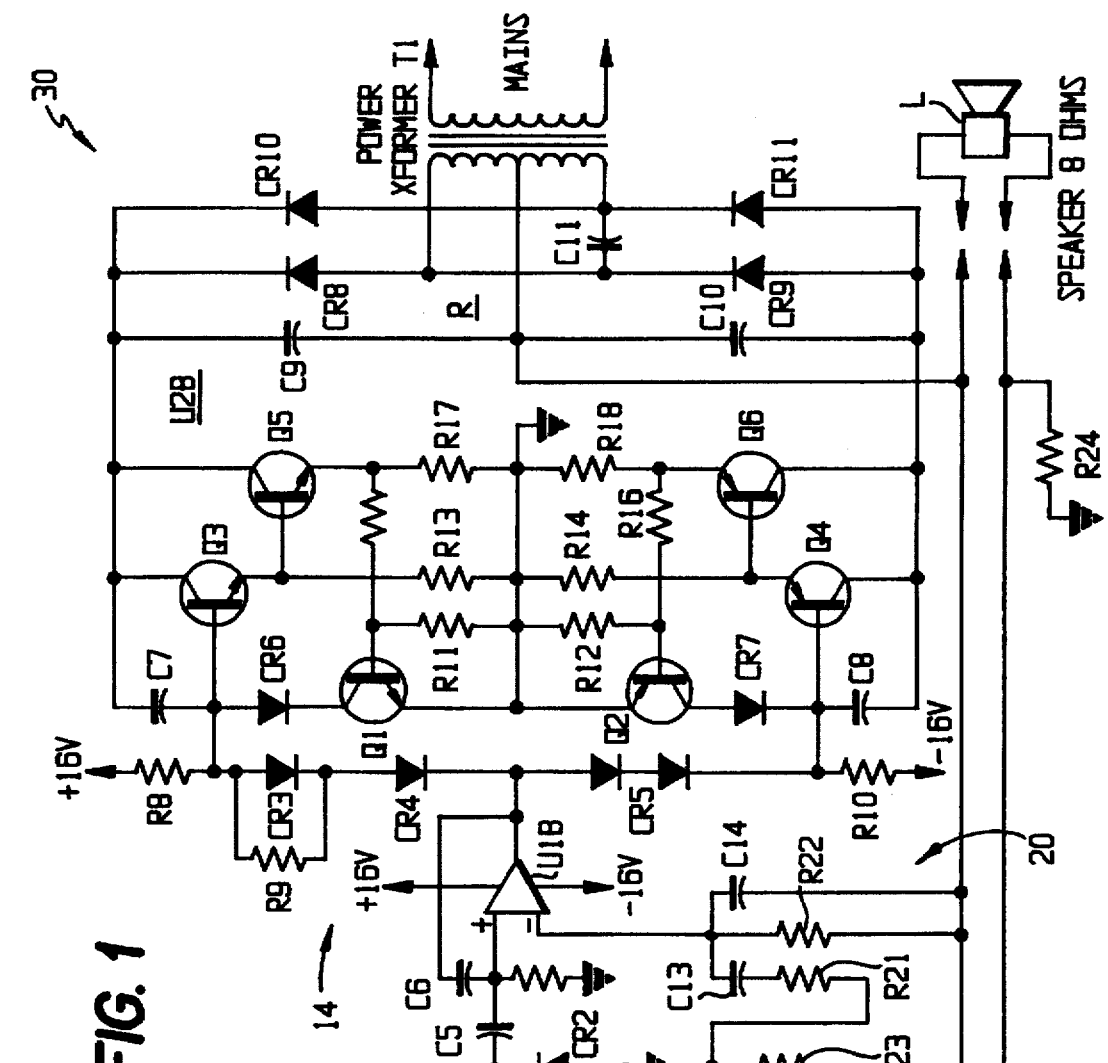
FIG. 1 is a schematic block diagram broadly illustrating the concept of the present invention.
Figure 1:
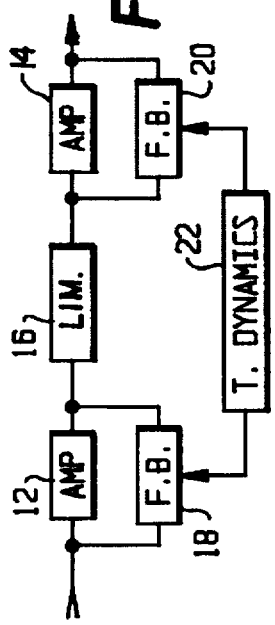

A variable output solid state power amplifier 10 according to the present invention is illustrated in FIG. 1. The amplifier 10 comprises a first amplifier stage 12 having an input and an output, a power amplifier stage 14 having a corresponding input and output, and a limit circuit 16 coupled between the output of the first amplifier 12 and the input of the power amplifier 14, as illustrated. The limit circuit 16 has an output voltage limit which limits the input to the power amplifier stage 14. Each amplifier 12 and 14 has a corresponding feedback circuit 18 and 20 coupled in feedback relationship between the corresponding input and output, as illustrated. An impedance control 22 is coupled between the feedback circuits 18 and 20. The impedance control or tube dynamics control (hereinafter T Dynamics) 22 is operative to introduce a decreasing impedance into feedback circuit 18 while at the same time increasing the impedance of the feedback circuit 20 and vice versa. In the exemplary embodiment, T Dynamics control 22 introduces a low impedance into the feedback circuit 18 of amplifier 12 causing a corresponding increase in its gain. At the same time, T Dynamics control 22 introduces a high impedance in the feedback circuit 20 of power amplifier 14 which causes its gain to decrease to a minimum. The power amplifier 14 has inherent clipping distortion at full power output which is manifested when the power amplifier 14 is at relatively high gain.

The limit circuit 16 is operative to limit the input signal to the power amplifier 14 when the gain of first amplifier 12 is increased and when the gain of the power amplifier 14 is decreased. In accordance with the invention, increasing the gain of amplifier 12 causes an increase in its output until the voltage limit of limit circuit 16 is reached. Thereafter, any further increase in signal level is unchanged at the input of power amplifier 14. In other words, the signal to the power amplifier 14 is clipped or limited. The T Dynamics control 22 is thus operative to allow the system to operate at a relatively low power level for good studio performance. When it is desired to increase the power level for stage performance, the gain of the first amplifier stage is reduced thereby reducing the effect of the limit circuit 16 and the gain of the power amplifier of 14 is simultaneously increased allowing it to produce its own inherent clipping distortion.

Figure 2:
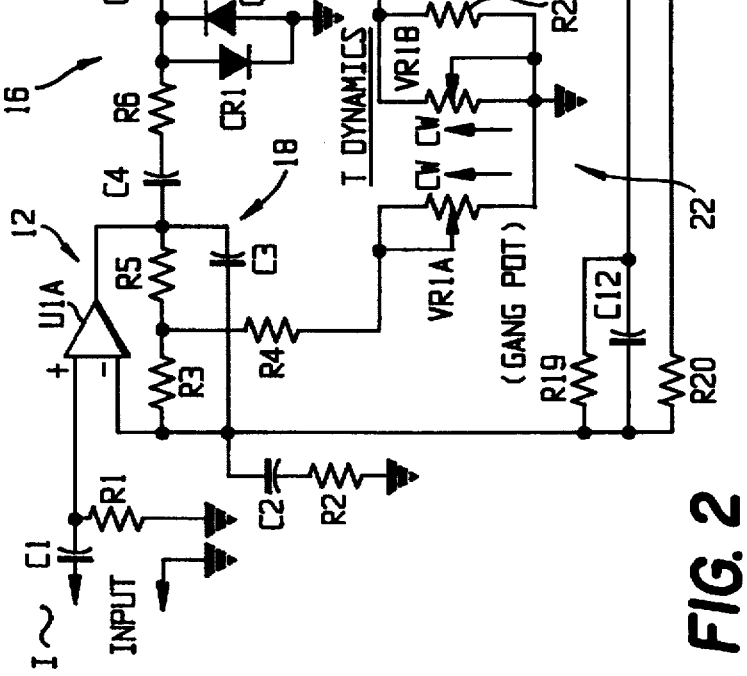
FIG. 2 is a schematic diagram illustrating in greater detail the concept of the present invention with a simplified limiting circuit.

FIG. 2 illustrates in greater detail an exemplary embodiment of an amplifier system 30 similar to the arrangement of FIG. 1, wherein similar elements have the same reference numbers. The amplifier 30 employs first and second amplifier stages 12 and 14, limit circuit 16, first and second feedback circuits 18 and 20, and T Dynamics control circuit 22. Amplifier 12 comprises an operational amplifier U1A, and amplifier 14 comprises a driven supply class-B power amplifier U2B with an operational amplifier driver U1B. The T Dynamics control 22 is coupled between the corresponding feedback circuits 18 and 20 of the operational amplifiers U1A and U1B, as illustrated.

In the circuit of FIG. 2, an input signal I is coupled through coupling capacitor C1 into the non-inverted input of operational amplifier U1A. Resistor R1 is commonly coupled with the capacitor C1 through non-inverting input of U1A to establish a ground reference. The first feedback circuit 18 of operational amplifier UA1 comprises series resistors R3 and R5 coupled between the output and the inverting input of amplifier U1A. Series connected capacitor C2 and resistor R2 are coupled between the inverting input of U1A and ground. Capacitor C2 provides DC blocking for resistor R2. Capacitor C3, coupled across the amplifier U1A, provides high frequency roll-off stability.

Resistor R19, associated with the feedback circuit 18, is coupled to the inverting input of U1A and the load L (e.g., speaker) and provides an overall voltage feedback path for the amplifier 30. Resistor R20 is likewise connected between the input of U1A and the load L for providing a current feedback path for the amplifier 30. Resistor R4 is coupled at a common node between the feedback resistors R3 and R5 to the impedance control 22 for limiting the maximum gain of the amplifier U1A. Capacitor C12, coupled across resistor R19, provides high frequency roll-off stability.

The T Dynamics control 22 includes a pair of ganged potentiometers VR1A and VR1B. When in the full clockwise position (CW), VR1A introduces maximum resistance (e.g., 10K ohm) into the circuit, and VR1B is at zero ohm. Likewise, at full counterclockwise position (CCW), VR1A is zero and VR1B is at maximum resistance (e.g., 10K ohm). Resistor R23 is coupled across VR1B to provide a minimum resistance in the feedback circuit of amplifier U1B, and thus provide a minimum gain characteristic therefor. When the impedance control 22 is turned full clockwise (CW), as noted above, VR1A is at its maximum value (e.g., 10k ohms). This setting results in a minimum gain value for operational amplifier U1A.

The signal across the limit circuit 16 is coupled through coupling capacitor C5 to the inverting input of the operational amplifier U1B in the power amplifier 14. Resistor R7 is coupled between the inverting input of U1B and ground providing a ground reference. Capacitor C6 is coupled between the output and the inverting input of U1B, providing high frequency roll-off stability.

In the arrangement illustrated in FIG. 2, limit circuit 16 comprises parallel diodes CR1 and CR2 connected in opposite polarity or back-to-back configuration. The operational amplifier U1A is coupled through coupling capacitor C4 and series resistor R6 to the limit circuit 16. The diodes CR1 and CR2 in the distortion circuit 16 serve as signal clippers whenever the signal conditions at this point are above the forward drop of the diodes (e.g., +/−0.6v peak). In other words, as its gain is increased, the output of amplifier 12 is ultimately constrained to the limit set by limit circuit 16. This, in turn, limits the input voltage to power amplifier 14 and thus limits overall system output.

Amplifier U1B is operative as a predriver for amplifier U2B, which in the exemplary embodiment is a complementary connected class-B amplifier. In the arrangement illustrated, resistors R8 and R10 act as drive resistors. Parallel connected diode CR3 and resistor R9 in series with diodes CR4 and CR5, establish a bias network between the drive resistors. Complementary drivers Q3 and Q4 are Darlington connected with complementary connected output devices Q5 and Q6 and the drive resistors R8 and R10, respectively. Complementary current limiting devices Q1 and Q2 are coupled between the base circuit of drivers Q3 and Q4 and the corresponding emitter circuits of the output devices Q5 and Q6. Complementary diodes CR6 and CR7 are coupled in the base-collector circuit of the drivers Q3 and Q4 and the current limiting devices Q1 and Q2. Resistors R11, R12 and R15, R16 are connected, as shown, as are complementary filter capacitors C9 and C10.

A bridge rectifier R circuit comprising diodes CR8–CR11 are coupled to a power transformer T. Capacitors C7 and C8 in the base collector circuit of the drivers Q3 and Q4 provide high frequency roll-off stability.

Operational amplifier U1B has a feedback circuit 20 which includes resistor R22 connected between the noninverting input and the load L. The resistor 22 provides a secondary overall feedback path for the amplifier 30. Resistor R21 is connected between the noninverting input of amplifier U1B and the variable resistor VR1B of impedance control 22. Resistor R21 limits the maximum gain of the amplifier U1B. Capacitor C14, coupled between the noninverting input of U1B and the load L, provides high frequency roll-off stability. Capacitor C13, coupled between the noninverting input and resistor R21, provides DC blocking for resistor R21.

Capacitor C11 is coupled in the secondary of the power transformer T and protects the bridge rectifier diodes CR8–CR11 from spike of voltages. When the impedance control circuit 22 is turned full clockwise (CW), variable resistor VR1B is at its minimum (zero ohms) which thereby results in a maximum gain for the amplifier U1B.

Resistor R24 is coupled between the load L and ground and provides output current sampling. Resistor R24 thus provides current feedback to reduce the damping factor of the amplifier 30 to a value which is similar to a tube type amplifier, for example, the damping factor is about one. As noted above, resistor R23 is coupled across the variable resistor VR1B to establish a minimum gain value for the operational amplifier U1B.

Having generally discussed the individual circuit components, the overall system operation and the interaction of the T Dynamics control 22 is discussed in greater detail below. Exemplary circuit component values are provided for illustration of the concept. Other values may be employed as desired.

Repeating the previous setting, full clockwise (CW) (or maximum setting), VR1A is at 10K ohms and VR1B is at zero. Thus U1A is at its minimum gain value and U1B is at its maximum gain value. The exemplary power amplifier 30 illustrated is intended to deliver approximately 50 WRMS into 8 ohms. Thus, this amplifier will deliver about 20 VRMS to the load L. Operational amplifier U1B has an feedback resistance (R22) of 100K ohms and a resistance to ground (R21+VR1B) of 1K (the impedance VR1B is currently at zero ohms). Thus, the gain of U1B is 101 (i.e., R22/R21+1). Hence, the input level at U1B is about 0.2 VRMS (20/101), or 0.282 volts peak. This level is considerably below the forward conduction level of diodes CR1 and CR2 in limit circuit 16. Consequently, the power amplifier 30 is capable of delivering 20 VRMS to the load L without the diodes CR1 and CR2 clipping the signal. Now, U1A is at its minimum gain value. Calculating the actual gain value of this stage is difficult since both major current and voltage feedback signals are returned to U1A via R19 and R20. However, it can be shown, when using the values provided, that the input sensitivity is about 1 VRMS at the input of U1A, and the overall system gain is about 20.

The circuit operation is now discussed with the T Dynamics control 22 set at full counterclockwise (CCW) (or minimum setting). VR1A is now at its minimum value (or in this case, zero ohms), and VR1B is at its maximum value of 10K ohms (resistor R23 is ignored for the moment). The amplifier 30 is again 50 WRMS into 8 ohm which delivers 20 VRMS to the load L. Operational amplifier U1B has an output feedback resistance (R22) of 100K ohms. However, the resistance to ground (R21 and VR1B) is 11K (the VR1B resistance is 10K ohms). Thus, the gain of U1B is about 9.09 (the gain being (R22/R21+VR1B+1). Hence, the input level at U1B is 2.20 VRMS (20/9.09) or about 3.11 volts peak. This level is considerably above the forward conduction level of CR1 and CR2, the clipper diodes, and thus they will prevent the power amplifier from delivering 20 VRMS to the load. Since the diodes clip at +−0.6 volts peak and the gain structure is 9.09, and the power amplifier delivers only about 5.45 volts peak signal to the load L. If input signals are reduced to where clipping is just beginning, there would be 0.42 VRMS at the diodes CR1 and CR2 and 3.85 VRMS (or 1.85 WRMS) at the power amplifier output. Thus, at the full CCW setting of the T Dynamics control 22, the power amplifier 14 delivers slightly less than 2 WRMS to the load "clean".

For most musicians, 2 WRMS is too low to be practical. Accordingly, resistor R23 is provided in parallel with VR1B section of the T Dynamics control 22 to thereby establish a minimum resistance to ground. It can be appreciated that the gain structure is now about 17, and the power amplifier will deliver about 7 WRMS to the load L "clean". This is a more practical minimum output level.

Referring again to operational amplifier U1A, at maximum gain, calculating the actual gain value of this stage is difficult for the same reasons as set forth above. However, it can be shown when using the designed values of FIG. 2, that the input sensitivity at U1A remains at about 1 VRMS, and the overall system gain is still at a value of about 20, below clipping as intended. Thus, at output levels below clipping of either the power amplifier 14 itself or the clipping diodes CR1–CR2, the gain structure of the overall amplifier 30 is the same regardless of whether the T Dynamics control 22 is set to maximum or to minimum.

The gain structure of the amplifier 30 can be maintained to about the same value for any setting of the T Dynamics control 22 by selecting the taper of the T Dynamics pot sections VR1A and VR1B. For the shown design, a 20% audio taper on VR1A and a 20% reverse audio taper on VR1B is effective. Thus, the T Dynamics control 22 becomes a power output adjustment, not simply a gain adjustment. The gain remains constant. To a musician, this means that the dynamics of the overload (clipping) point of the power amplifier may be adjusted. This is a desirable feature to have in any guitar amplifier, and this is achieved by means of the gang pot used for the T Dynamics control 22. One section controls the input gain, one section controls the power amplifier gain. By careful design, the overall gain is nearly always the same regardless of the control setting. Also, as the control setting is reduced, a clipping function will begin to limit the output power in direct proportion to the control setting.

Additional features of the invention are discussed with respect to the FIGS. 3–6. The reference numerals for similar elements described in the previous figures are retained. Reference numerals have been added or deleted as necessary when corresponding elements have been added or deleted from FIG. 2.

Figure 3:
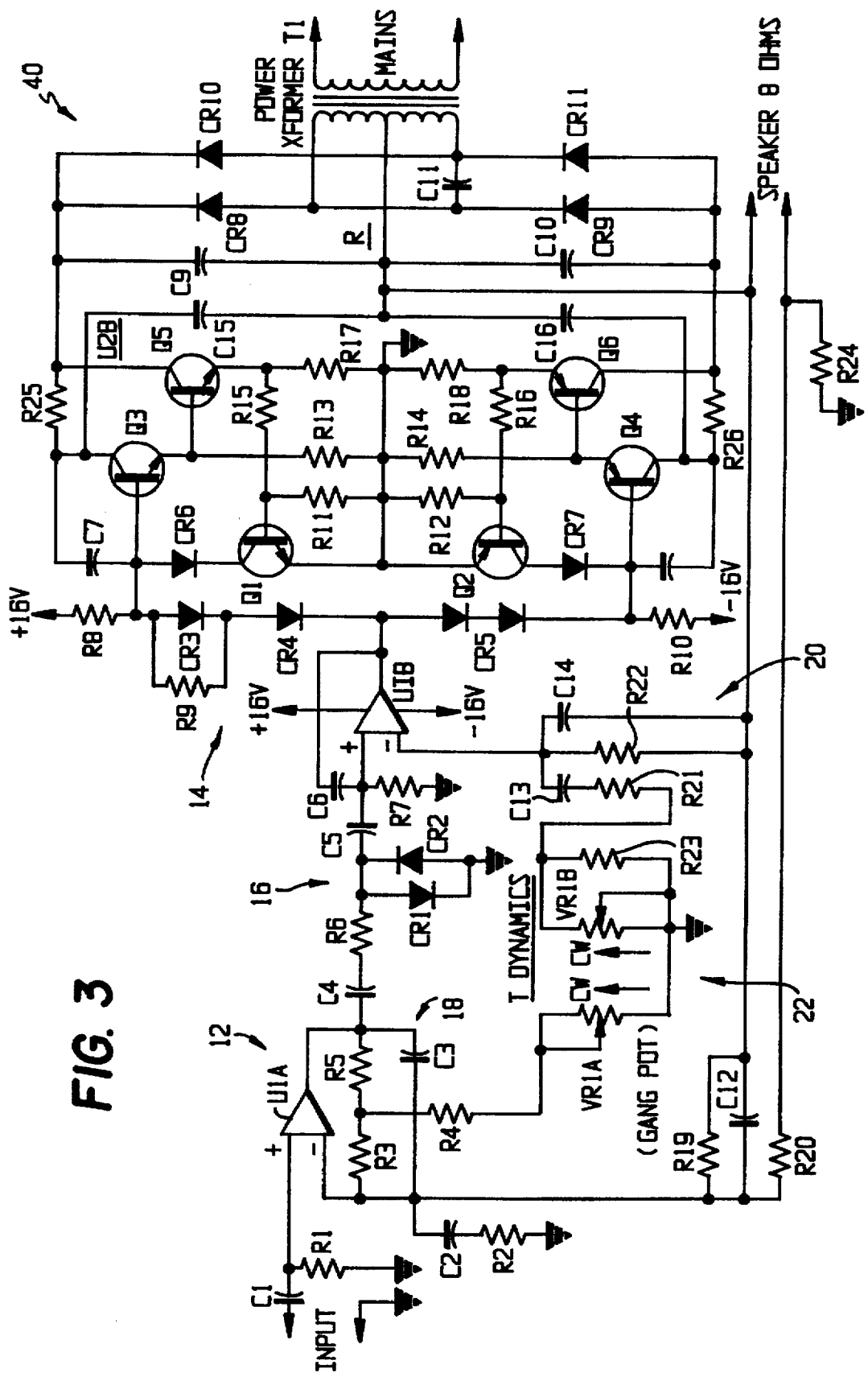
FIG. 3 is a schematic diagram similar to the arrangement of FIG. 2 further employing a ripple filter for reducing annoying line hum introduced during high power operation.

FIG. 3 illustrates an amplifier 40 similar to the arrangement of FIG. 2 except for the addition of two decoupling resistors R25 and R26, and two filter capacitors C15 and C16. These components are added to provide an important feature not found on most typical solid state power amplifiers. This feature is the elimination of the power supply hum component introduced into the output signal of most guitar power amplifiers at clipping.

Whenever a typical solid state power amp clips (the output swing exceeds the power supply rail voltage), the power supply ripple signal modulates the peak output swing of the amplifier, causing an annoying introduction of a 120 Hz (full wave rectified 60 Hz mains) hum signal into the guitar amplifier output. This is noticeable in the sound at full power levels. Most manufacturers simply cannot afford to use extremely large values of power supply capacitors necessary to reduce the hum modulation signals to below that which is objectionable to most musicians. Also, this modulation problem usually occurs only at full power output. Operation at power levels below clipping does not produce these undesirable results. Also, of note is that most tube power amplifiers, because they operate at high voltages and lower currents, have proportionally lower power supply ripple values, and thus generally produce less annoying hum generation type problems at clipping than do their solid state amplifier counterparts.

By introducing a decoupling resistor and an additional filter capacitor for the corresponding supply rails of the drivers Q3 and Q4, the hum component introduced at clipping is thus reduced significantly to below the annoyance level for most musicians.

In the exemplary embodiment, the main power supply capacitors C9 and C10 are 2200 UF. The added capacitors C15 and C16 are only 220 UF. However, the resultant reduction in hum component introduction at clipping is better than if the main power supply capacitors were increased to 10,000 UF (four times the original size). This then offers a more economical solution to the problem. The only disadvantage to this approach is the slight reduction in overall continuous power output capability due to the voltage drop in the decoupling resistors R25 and R26. For the values used in the exemplary embodiment, the original 50 WRMS output power capability was reduced to about 44 WRMS (or about −0.5 dB in output level) this is a small reduction in output power, in view of the overall improved performance.

The value of resistors R25 and R26 should be large enough so as to offer the extra filter capacitors C15 and C16 an adequate impedance with which to work; and at the same time R25 and R26 should not be too large as to further reduce the output power capability of the amplifier 30 itself. The value of capacitors C9 and C10 should be large enough to provide the adequate filtering to eliminate the hum component in the output.

The circuit arrangement of FIG. 3 also offers an additional advantage in the music power rating of the power amplifier 14. Music power is the instantaneous output power capability measured in WRMS that the system will deliver to the load L for a short period of time until the supply voltages stored in the capacitors sag under a continuous loading condition. This rating usually determines how loud a particular power amplifier will sound to the musician or just how much so-called "kick" it has under transient conditions. Most typical tube power amplifiers have a much higher music power rating than a solid state counterpart of the same continuous WRMS rating. It is not uncommon for a 50 WRMS tube power amp to deliver 200 WRMS music power. This is why most musicians consider a tube power amplifier superior for guitar applications. Tubes deliver more music (or transient) power, and yet are far easier on the associated loudspeaker whose failure mechanism is more related to continuous WRMS rather than music WRMS.

At idle conditions, the extra filter capacitors C15 and C16 are charged up to the same voltage as the main filter capacitors C9 and C10, so the music power rating is unaffected by the addition of this circuitry. At full continuous operation, however, resistors R25 and R26 drop the voltage level supplied to the drivers Q3 and Q4 with the resulting power loss as outlined above. This then makes this solid state power amp have a music to continuous WRMS ratio closer to that of a tube power amplifier.

It should be noted that whenever the T Dynamics control 22 is at the maximum setting, the power amplifier 14 is clipped at maximum output. Accordingly, the hum reduction feature described herein comes into play to eliminate the ripple noise. However, whenever the T Dynamics control 22 is at a setting other than maximum, the internal clipping function limits the output swing, and thus the amplifier output swing is prevented from reaching the rails.

Figure 4:
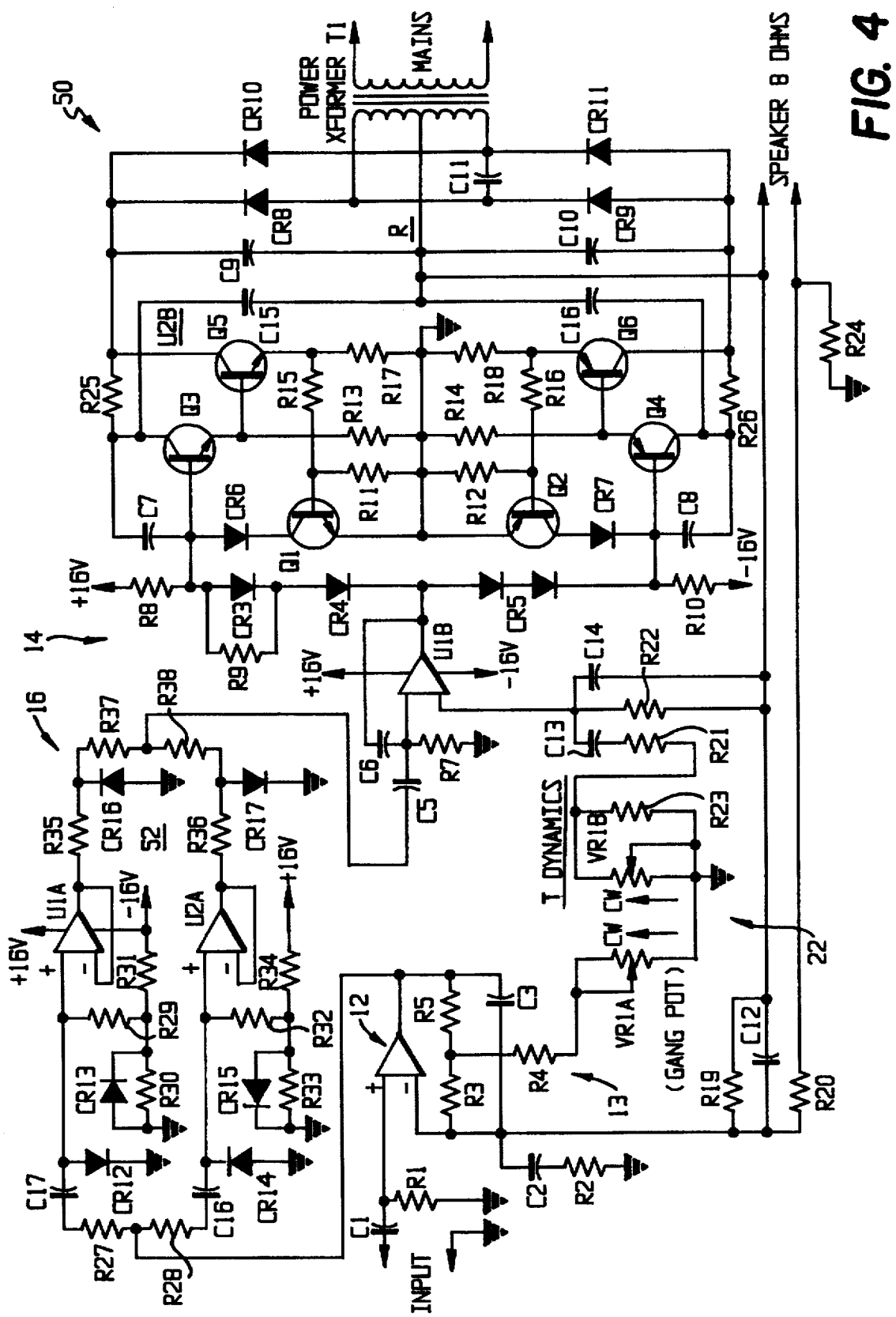
FIG. 4 is a schematic diagram of the invention similar to FIG. 3 in which a compression circuit is combined with the limiting circuit for introducing controlled cross-over distortion.

FIG. 4 illustrates an amplifier 50 incorporating another feature of the invention wherein a compression circuit 52 is combined in the limiting circuit 16. In the arrangement illustrated, the clipping diodes CR1 and CR2 (FIG. 3) are replaced with a compression circuit 32 similar to the arrangement disclosed in U.S. patent application "Solid State Tube Compression Circuit," Ser. No. 08/182,493, filed Jan. 18, 1994, Attorney Docket No. 147-232, assigned to the assignee herein, the teachings of which are included by reference. This modification provides means to create a tube compression effect as outlined in the application and at the same time produces limiting means to control or change the output power level at which the tube compression effect takes place. In the arrangement of FIG. 3, the T Dynamics control 22 is effective to change the gain structure of the circuitry around the clipping diodes CR1 and CR2. T Dynamics control causes diodes CR1 and CR2 to clip the signal at output power levels below full power, while maintaining the same overall gain structure at output levels below clipping for any setting of the T Dynamics control 22. In the arrangement of FIG. 4, the hard clipping provided by the diodes CR1 and CR2 is replaced with a compression circuit 52 that introduces cross-over distortion resulting in soft, tube-like compression at clipping. This effect is far more pleasing to musicians who would desire this feature, and in actual usage it duplicates very closely the actual operation in an actual tube type power amplifier. As with the diodes, the circuitry of FIG. 4 maintains the same overall gain structure at output levels below clipping for any setting of the T Dynamics control 22. Thus, this control is still an effective means to adjust the power amplifier dynamics to match his playing style for clipping and overload.

The compression circuit 52 emulates tube compression associated with an overbiased class-B push-pull tube amplifier at high input signal levels due to a flow of current into the grid of the output tubes resulting in an output clipping characteristic with crossover distortion. In the embodiment illustrated, the compression circuit comprises a pair of class-B connected solid state upper and lower unity gain operational amplifier devices U1A, U2A, each including an input circuit and output circuit. The output circuit of the paired devices are connected for mixing. In the upper circuit a biasing circuit, including complementary connected diodes CR12, CR13 and resistors R29, R30 and R31 establish a clipping level offset at the input and at the output of each device. The lower circuit is the same. Clipping devices CR12 and CR16 in the input circuit and the output circuit respectively clip the offset at the input and the offset at the output of each solid state device. A charging device, capacitor C17 and resistor R27, overbiases the offset in the input circuit whenever the input signal is greater than the input clipping device CR12. The overbiasing causes crossover distortion, emulating the desirable compression associated with a tube amplifier. The offset voltage in the exemplary embodiment is a diode voltage drop, e.g., about 0.6 VDC.

The previous discussions concerning the gain structure of the power amplifier at various settings of the T Dynamics control 22 applies to the arrangement of FIG. 4 and need not be repeated. Of interest is that the tube compression circuitry 52 may be defeated by simply shorting capacitors C17 and C18. When these capacitors are shorted, the circuitry is essentially reduced to the diode clipping circuit previously described, where the diodes CR12 and CR13 in FIG. 4 act in a similar manner to the diodes CR1 and CR2 in FIGS. 2 and 3, as a simple hard clipping means. When capacitors C17 and C18 are not shorted, the bias circuitry and various other circuit components come into play to cause not only clipping, but compression as outlined in the above-identified patent application. The T Dynamics control 22 allows flexibility in the operation of the tube compression circuit 33 by providing the ability to change the power output level at which the compression effect occurs.

FIG. 4 also employs the decoupling resistors R25 and R26 and capacitors C15 and C16 to eliminate the power supply hum component introduced into the output signal. Although, not necessary for the successful operation of the T Dynamics control 22 with the tube compression circuitry 33, this feature helps to more fully duplicate a typical tube power amplifier, and thus it is desirable.

U.S. Pat. No. 5,197,102, entitled Frequency Selective Damping Factor Control, assigned to the assignee herein, employs two power amplifier controls in an arrangement called presence and resonance. The presence control produces a reduction of the damping factor at high frequencies (1 Khz and above) which effectively raises the high end response of the associated loudspeaker system at the frequencies where the impedance characteristics rises. This offers the musician a brighter, strident type sound. The resonance control produces a reduction of the damping factor at low frequencies (500 Hz and below) which effectively increases the low end response of the associated loudspeaker system most noticeably at the resonance frequency of the enclosure where the impedance is highest. This offers the musician a punchy, boomy type sound.

Noteworthy features of these controls is their ability to improve both the high and low end response (sounds) of the typical guitar or bass music at low performance levels (below any power amp clipping), but at high performance levels (above power amp clipping) their effects are defeated. To a musician, this means a bright or punchy type sound may be played softly, but when the power is increased, the bright does not turn into so-called "cutting" and the punch does not turn into "mushy" overload.

Figure 5:
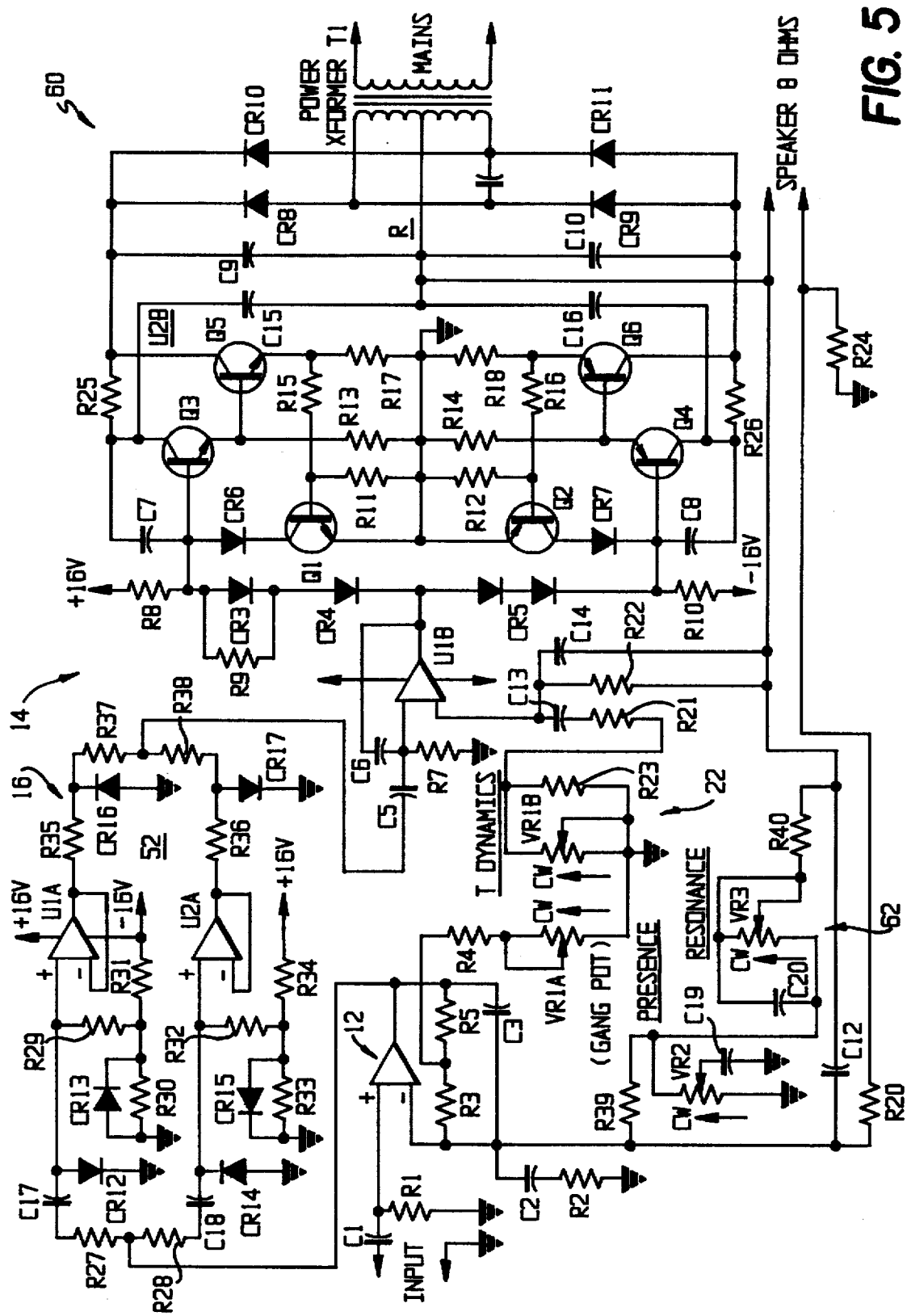
FIG. 5 is a schematic diagram combining elements of FIGS. 3 and 4 and further including a presence and resonance circuit for varying the damping factor of the load.

In FIG. 5, an amplifier 60 is illustrated in which the overall power amplifier feedback resistor R19 (FIGS. 2–4) is replaced with a frequency selective network 62 or presence and resonance (P&R) control comprising resistors R39 and R40, capacitors C19 and C20, and potentiometers VR2 (the presence control) and VR3 (the resonance control). When both VR2 and VR3 are set at their full counterclockwise (CCW) or minimum setting, the frequency selective network 62 is reduced to a simple divider resistor network.

namely R40, VR2 and R39. This network now offers the same effect as the resistor R19 (FIG. 4) which is essentially a flat response with no presence or resonance boost. If either or both of the controls VR2 and VR3 are set in any clockwise (boosted) setting, the network 62 offers an altered frequency response to provide the desired damping factor reduction in either the high or low frequency spectrum. The details of this are more fully discussed in the aforementioned patent and need not be repeated herein.

Of importance is that the control 62 functions as intended in the circuit of FIG. 5, and their effects are not altered by changes in the T Dynamics control 22, because the frequency selective network 62 connects from system output to system input, and the T Dynamics control 22 is designed to maintain the overall gain value from input to output. Also, of importance is that the network 62 ceases to function whenever either the power amplifier clips 14 or when the tube compression circuitry 52 is activated. The network 62 is a feedback function. Both power amplifier clipping and tube compression circuitry activation limit the feed-forward signal which then defeats any feedback control. Thus, the T Dynamics control 22 can set the output power capability of the amplifier, and not alter the functions of the presence and resonance controls 62; but the control functions of the network 62 are defeated at the clipping level set by the T Dynamics control 22.

The invention may be combined with a preamplifier circuit, such as disclosed in U.S. patent application entitled "Solid State Circuit," Ser. No. 08/179,546, filed Jan. 10, 1994, Attorney Docket No. 147-229, assigned to the assignee herein, the teachings of which are incorporated herein by reference. The amplifier of the invention may also include a tone control circuit similar to the presence and resonance circuit; or other tone controls may be employed in addition or in lieu of the circuit.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. An amplifier comprising:

a first amplifier stage having an input, an output and a feedback circuit, said first amplifier having a first gain for producing a relatively low power output;

a second amplifier stage having an input, an output and a feedback circuit, said second amplifier having a second gain for producing relatively high power output and having inherent clipping distortion at relatively high power output, the first gain and the second gain establishing an overall gain structure for the amplifier;

limit means having a clipping level and being coupled between the output of the first amplifier stage and input of the second amplifier stage operative for limiting input voltage to the second amplifier stage above the clipping level of the limit means when the gain of the first amplifier stage is relatively high and when the gain of the second amplifier stage is relatively low;

tube dynamics control means coupled to the feedback circuit of the first amplifier stage and to the feedback circuit of the second amplifier stage for simultaneously changing feedback impedance in the respective feedback circuits in opposite first and second directions while preserving the overall gain structure of the amplifier, said control means operative in the first direction for raising the gain of the first amplifier and rendering said limit means operative, and simultaneously reducing the gain of the second amplifier stage and reducing the output power thereof so that the overall gain structure is preserved; and operative in the second direction for increasing the gain of the second amplifier stage for allowing the introduction of the inherent clipping distortion, and for simultaneously lowering the gain of the first amplifier stage so that the overall gain structure is preserved.

2. The amplifier of claim 1 wherein the control means comprises a dual ganged potentiometer having first impedance coupled in the first feedback circuit and a second impedance coupled in the second feedback circuit, said dual ganged potentiometer operative in the first direction for raising the first impedance while lowering the second impedance and operative in the second direction for lowering the first impedance while raising the second impedance.

3. The amplifier of claim 1 further including impedance means coupled in the second feedback circuit for introducing minimum gain value in the second amplifier.

4. The amplifier of claim 1 wherein the limit means comprises clipping means operative for limiting the output of the first amplifier stage below a selected voltage clipping level thereof.

5. The amplifier of claim 4 wherein the clipping means comprises a pair of parallel diodes connected in opposite polarity, commonly coupled to the output of the first amplifier stage and the input of the second amplifier stage and to ground.

6. The amplifier of claim 1 wherein the limit means comprises a solid state equivalent means for emulating tube compression effect associated with an overbiased complementary connected tube amplifier at high input signal levels.

7. The amplifier of claim 6 wherein the means for emulating tube compression further comprises:

at least one pair of complementary connected solid state devices, each including an input circuit and output circuit, and the output circuit and said paired devices being connected for mixing;

biasing means in the input circuit of each paired device for establishing a clipping level offset at the input circuit and the output circuit of each device;

clipping means in the input circuit and the output circuit respectively clipping the offset at the input circuit and the offset at the output circuit of each solid state device;

charging means for overbiasing the offset in the input circuit whenever the input signal is greater than said input clipping means, said overbiasing causing crossover distortion, emulating the desirable compression associated with a tube amplifier.

8. The amplifier of claim 7 wherein the diode biasing means in input circuit of said paired solid state devices comprise parallel diodes connected in opposite polarity.

9. The amplifier of claim 7 wherein the biasing means in the input circuit of each solid state device includes a diode and a resistor network coupled to the input circuit.

10. The amplifier of claim 7 wherein the clipping means in the input circuit and the output circuit comprise parallel diodes connected in opposite polarity.

11. The amplifier of claim 7 wherein the solid state devices comprise operational amplifiers.

12. The amplifier of claim 7 wherein the charging means comprises a resistor capacitor network in the input circuit of each solid state device.

13. The amplifier of claim 7 wherein the offset at the input equals at least one diode voltage drop and the offset in the output circuit equals said at least one diode voltage drop.

14. The amplifier of claim 1 wherein the gain of each solid state device is unity.

15. The amplifier of claim 1 further comprising ripple filter means coupled to the second amplifier for suppressing line harmonics associated with operation of the second amplifier at maximum power output.

16. The amplifier of claim 15 wherein the ripple filter means comprises a decoupling resistor serially connected in a drive circuit for the second amplifier and a parallel connected capacitor likewise connected in the drive circuit of the second amplifier.

17. The amplifier of claim 1 wherein the second amplifier comprises complementary Darlington connected driver and output devices.

18. The amplifier of claim 17 wherein the second amplifier means further includes complementary connected current limiting devices in an input circuit of each of the complementary connected drivers.

19. The amplifier of claim 1 wherein the amplifier has a load circuit and further including frequency selective variable damping control means coupled to the load circuit.

20. The amplifier of claim 19 wherein the frequency selective variable damping factor control means comprises:

current feedback means in the feedback circuit;

first variable impedance means in the feedback circuit to ground for varying overall feedback to the amplifier input as the frequency increases above the selected frequency; and second variable impedance means in the feedback circuit between the input and the output for varying overall feedback to the amplifier input as the frequency decreases below the selected frequency, said first and second variable impedance means being operative with respect to each other to selectively reduce feedback delivered to the load in said feedback circuit in accordance with its respective impedance and said current feedback means being operative to selectively increase power delivered to the load with changing frequency above and below said selected frequency at load resonance and high frequency cut-off.

21. The amplifier of claim 6 wherein the means for emulating tube compression effect further comprises:

at least one pair of complementary connected solid state devices, each including an input circuit and output circuit, said at least one pair being connected for mixing;

biasing means in the input circuit of each paired solid state device for establishing an offset level at the input circuit and the output circuit of each device;

clipping means in the input circuit and in the output circuit each having a respective clipping level relative to the offset level for clipping signals at the input circuit and clipping signals at the output circuit of each solid state device;

charging means for overbiasing the input circuit whenever the input signal is greater than said input clipping level, said overbiasing causing crossover distortion, emulating the desirable compression effect associated with a tube amplifier.

22. The amplifier of claim 21 wherein the clipping means in the input clips signals greater than the clipping level plus the offset level.

23. The amplifier of claim 21 wherein the clipping means in the output circuit clips unused opposite half cycles of the input signals.

24. The amplifier of claim 1 wherein the first amplifier comprises:

a pair of complementary connected solid state devices, each having an input circuit and an output circuit, the output circuits being connected for mixing;

offset means in the input circuit of each solid state device for establishing an offset level at the input circuit and at the output circuit thereof;

clipping means having a clipping level relative to the offset level in the input circuit for clipping input signals relatively greater than the clipping level plus the offset level;

charging means for overbiasing the input circuit whenever the input signal is greater than said offset level and said clipping level, said overbiasing causing crossover distortion.

25. The amplifier of claim 24 further including means at the output of each solid state device for clipping unused opposite half cycles of the input signals.

26. The amplifier of claim 25 wherein the means at the output of each solid state device comprises a diode forward biased with respect to the input for clipping opposite half cycles of the input signal to each solid state device.

27. An amplifier comprising:

a first amplifier stage having an input, an output and a feedback circuit, said first amplifier having a first gain for producing an output;

a second amplifier stage having an input, an output and a feedback circuit, said second amplifier having a second gain for producing relatively high power output and having inherent clipping distortion at relatively high power output, said first and second gains together resulting in a gain structure for the amplifier;

limit means having a clipping level, including crossover distortion means for emulating tube compression effect, coupled between the output of the first amplifier stage and input of the second amplifier stage operative for limiting input voltage to the second amplifier stage above the clipping level of the limit means when the gain of the first amplifier stage is relatively high and when the gain of the second amplifier stage is relatively low; and tube dynamics control means coupled between the feedback circuit of the first amplifier stage and the feedback circuit of the second amplifier stage for simultaneously changing feedback impedance in the respective feedback circuits in opposite first and second directions while maintaining said gain structure, said control means operative in the first direction for raising the gain of the first amplifier and rendering said limit means operative, and reducing the gain of the second amplifier stage and consequently reducing the output power thereof; and for operation in the second direction increasing the gain of the second amplifier stage for allowing the introduction of the inherent clipping distortion and for lowering the gain of the first amplifier stage.

* * * * *